(12) United States Patent
Kim et al.

(10) Patent No.: US 7,898,610 B2
(45) Date of Patent: Mar. 1, 2011

(54) LIQUID CRYSTAL DISPLAY DEVICE AND METHOD OF FABRICATING THE SAME

(75) Inventors: Kyung-Lock Kim, Suwon (KR); Seung-Han Paek, Bupyeong-Gu (KR)

(73) Assignee: LG. Display Co., Ltd., Seoul (KR)

( * ) Notice: Subject to any disclaimer, the term of this patent is extended or adjusted under 35 U.S.C. 154(b) by 626 days.

(21) Appl. No.: 11/644,080

(22) Filed: Dec. 21, 2006

(65) Prior Publication Data

US 2008/0002087 A1    Jan. 3, 2008

(30) Foreign Application Priority Data

Jun. 30, 2006  (KR) .................. 10-2006-0061655
Dec. 7, 2006   (KR) .................. 10-2006-0124002

(51) Int. Cl.
G02F 1/136   (2006.01)
H01L 21/336  (2006.01)
H01L 21/44   (2006.01)

(52) U.S. Cl. .................. 349/46; 438/197; 438/652

(58) Field of Classification Search ........... 349/43, 349/46

See application file for complete search history.

(56) References Cited

FOREIGN PATENT DOCUMENTS

| TW | 256028 B | 6/2006 |
|---|---|---|
| TW | 256497 B | 6/2006 |
| TW | 256732 B | 6/2006 |
| TW | 257021 B | 6/2006 |
| TW | 257134 B | 6/2006 |
| WO | 2004/061991 A1 | 7/2004 |
| WO | WO 2004061991 A1 * | 7/2004 |

OTHER PUBLICATIONS

Office Action issued in corresponding Taiwanese Patent Application No. 095149351; issued Dec. 11, 2009.

* cited by examiner

*Primary Examiner*—Sarah Song
(74) *Attorney, Agent, or Firm*—Brinks Hofer Gilson & Lione

(57) ABSTRACT

An LCD device and a method of fabricating the device, in which the method includes preparing an insulating substrate including a gate wiring area and sequentially forming a gate wiring layer including a silver layer and a self-assembled monolayer on the insulating substrate. A mold mask is positioned above the insulating substrate, where the mold mask has a predetermined pattern to expose the gate wiring area. A self-assembled monolayer pattern is formed by printing the predetermined pattern of the mold mask into the self-assembled monolayer and a gate wiring pattern is formed by selectively etching the silver layer using the self-assembled monolayer pattern as an etching mask, where the gate wiring pattern includes a gate pad, a gate electrode and a gate line. The LCD device includes a gate wiring layer including a self-assembled monolayer and a metal layer of silver overlying an insulating substrate.

9 Claims, 8 Drawing Sheets

US 7,898,610 B2

LIQUID CRYSTAL DISPLAY DEVICE AND METHOD OF FABRICATING THE SAME

RELATED APPLICATION

The present disclosure relates to subject matter contained in priority Korean Application Nos. 10-2006-061655, filed on Jun. 30, 2006 and 10-2006-124002, filed on Dec. 7, 2006, both which are incorporated by reference in its entirety.

BACKGROUND

1. Technical Field

The present invention relates to a liquid crystal display (LCD) device and a method of fabricating the same, and more particularly, to an LCD device of which a gate wiring is formed of a metal layer of silver (Ag), to improve the uniformity in line width and surface state of the gate line, and a method of fabricating the same.

2. Description of the Background Art

Generally, an LCD device can control the transmittance of light in liquid crystal cells based on a video signal. That is, an image corresponding to the video signal is displayed on an LCD panel which is provided with the liquid crystal cells arranged in a matrix configuration. For this, the LCD device includes an active area which is comprised of the liquid crystal cells arranged in the matrix configuration; and driving circuits which drive the liquid crystal cells of the active area.

FIG. 1 is a plan view of illustrating a related art LCD device. FIG. 2 is a cross section view along A-A' of FIG. 1.

Referring to FIGS. 1 and 2, the related art LCD device includes upper and lower substrates 10 and 20 facing each other and being bonded to each other, wherein the LCD device is divided into a display region 4 provided with liquid crystal cells; a sealant 2 provided along the circumference of the upper and lower substrates 10 and 20; and a plurality of dots 3 provided in the circumference of the sealant 2, wherein the dots 3 electrically connect the upper and lower substrates 10 and 20 to each other.

Referring to FIG. 2, the display region 4 is provided with the upper substrate 10 including a black matrix 30, a color filter 15, a common electrode 17, and an upper alignment layer 19 which are sequentially formed on a second substrate 11; the lower substrate 20 including a thin film transistor (TFT), a pixel electrode 31, and a lower alignment layer 33 which are sequentially formed on a first substrate 21; and a liquid crystal layer (not shown) which is formed in a space formed between the upper and lower substrates 10 and 20 through the use of spacers 35.

First, the detailed structure of the upper substrate 10 will be explained as follows.

The black matrix 30 is arranged on the second substrate 11, wherein the black matrix 30 of the matrix configuration divides a plurality of cell regions for the color filters 15, to thereby prevent the light from being coherent in the adjacent cell regions.

Then, red (R), green (G) and blue (B) color filters 15 are sequentially formed on the second substrate 11 including the black matrix 30. In order to form each of the color filters 15, a predetermined material layer is coated onto an entire surface of the second substrate 11 including the black matrix 30, and is then patterned, wherein the predetermined material layer absorbs a white light source, and transmits only the light corresponding to a predetermined color (for example, red, green or blue). At this time, the common electrode 17 is formed on the second substrate 11 including the black matrix 30 and the color filter 15, wherein the common electrode 17 is formed of a transparent conductive layer. The common electrode 17 is supplied with a ground electric potential. Then, the upper alignment layer 19 is formed on the upper substrate 10 including the common electrode 17. In this case, the upper alignment layer 19 is formed by coating the common electrode 17 with polyimide.

The detailed structure of the lower substrate 20 will be explained as follows.

First, the thin film transistor (TFT) is formed on the first substrate 21, wherein the thin film transistor (TFT) switches the operation of liquid crystal molecules. The thin film transistor (TFT) is comprised of a gate electrode 25 protruding from a gate line (not shown), and source and drain electrodes 28S and 28D protruding from a data line (not shown). Also, the thin film transistor (TFT) includes a semiconductor layer 26 and 27, and a gate insulation layer 23. In this case, the semiconductor layer 26 and 27 forms a transmission channel between the source and drain electrodes 28S and 28D with a gate voltage applied to the gate electrode 25. Also, the gate insulation layer 23 is positioned between the gate electrode 25 and the semiconductor layer 26 and 27, to thereby insulate the gate electrode 25 from the source and drain electrodes 28S and 28D.

Then, a passivation layer 29 is formed on an entire surface of the substrate including the thin film transistor (TFT). At this time, the passivation layer 29 is provided with a contact hole 29H which exposes the drain electrode 28D. On the substrate including the passivation layer 29, there is the pixel electrode 31 which is formed in the contact hole 29H and is electrically connected with the drain electrode 28D. At this time, the pixel electrode 31 is positioned in the cell region divided by the gate and data lines, wherein the pixel electrode 33 is formed of a transparent conductive material having the high rate of light transmittance. Then, the lower alignment layer 33 is formed on the first substrate 21 including the pixel electrode 31.

The thin film transistor (TFT) selectively supplies a data signal of the data line to the pixel electrode 31 in response to a gate signal of the gate line. According to a voltage difference between the data signal supplied through the thin film transistor (TFT) and a common voltage (Vcom) supplied to the common electrode 17, the liquid crystal molecules are rotated, whereby the light transmittance is controlled based on the rotation degree of the liquid crystal molecules.

After forming the sealant 2 and the dots 3 along the circumstance of the second substrate 11 for the upper substrate 10 or the first substrate 21 for the lower substrate 20, the spherical spacers 35 are scattered on any one of the substrates. After that, the upper and lower substrates 10 and 20 are positioned in opposite to each other, and are bonded to each other. Then, liquid crystal is injected into a space between the two substrates, and is sealed, thereby completing the LCD device.

In the LCD device having the above-explained structure, the gate electrode 25 is generally formed by patterning a metal layer of silver (Ag) in a photolithography method. That is, a layer of silver (Ag) is deposited on the substrate, and is then etched by using an additional photoresist pattern, thereby forming the gate electrode 25.

If using the photolithography method, a photoresist layer is coated in a spin-coating method. In this case, the photoresist layer may be damaged. Also, the photolithography method necessarily requires the exposure and development process of the photoresist layer, and the process of removing the photoresist pattern. In addition, it is necessary to perform a cleaning process between the silver-metal layer deposition process and the photoresist layer patterning process. Accordingly, the exposure process requires a laser exposure device, so that the fabrication cost and time increase.

As explained above, if the gate electrode is silver metal having the great resistivity, the fabrication cost increases due to the expansive layer of silver. Furthermore, if the layer of silver is patterned by the photolithography method, the amount of silver used increases, whereby the fabrication cost increases.

To overcome this problem, instead of the photolithography method, there has been proposed a printing method to form the gate electrode 25 from the metal silver (Ag). That is, the desired portions of the lower substrate are printed with silver, directly, thereby forming the gate electrode 25. The method of forming the gate electrode by the printing method will be explained in detail.

FIGS. 3A and 3B are cross section views of illustrating a method of fabricating an LCD device using a related art printing method.

First, as shown in FIG. 3A, silane molecules are printed onto an insulating substrate 41, whereby a silane pattern 43 is formed selectively. The insulating substrate 41 may be formed of a glass substrate. The silane pattern 43 is arranged at a fixed interval, to thereby expose the predetermined portion for the gate electrode.

Referring to FIG. 3B, a layer of silver (Ag) grows between each of the silan patterns 43 on the insulating substrate by the printing method. Thus, the gate electrode 25 of silver (Ag) is formed on the insulating substrate.

When forming the gate electrode of silver (Ag) by the printing method, the silver grows between each of the silane patterns. In comparison with the photolithography method, the printing method uses a smaller amount of silver. Even though silver used for the gate line has the good resistivity, silver is easily oxidized. Furthermore, if the silane molecules are adsorbed into the silver, the adsorption conditions is troublesome. Thus, it is difficult to obtain uniformity in line width and in the surface state of the gate line.

SUMMARY

In accordance with the present invention, as embodied and broadly described herein, there is provided an LCD device including an insulating substrate and a gate wiring layer overlying the insulating substrate. The gate wiring layer includes a gate electrode, a gate pad and a gate line and comprises a dual-layered structure including a self-assembled monolayer and a metal layer comprising silver.

In another aspect of the invention, an LCD device includes an insulating substrate and a gate electrode overlying the insulating substrate. The gate electrode includes a dual-layered structure including a metal layer comprising silver and a self-assembled monolayer overlying the metal layer. A gate insulating layer overlies the insulating substrate and the gate electrode and an active layer overlies the gate insulating layer. Source and drain electrodes reside on the active layer and the source electrode is separated from the drain electrode by a fixed distance. A pixel electrode is coupled to the drain electrode.

In yet another aspect of the present invention, a method of fabricating an LCD device includes preparing an insulating substrate including a gate wiring area and sequentially forming a gate wiring layer comprising a silver layer and a self-assembled monolayer on the insulating substrate. A mold mask is positioned above the insulating substrate, where the mold mask has a predetermined pattern to expose the gate wiring area. A self-assembled monolayer pattern is formed by printing the predetermined pattern of the mold mask into the self-assembled monolayer and a gate wiring pattern is formed by selectively etching the silver layer using the self-assembled monolayer pattern as an etching mask, where the gate wiring pattern includes a gate pad, a gate electrode and a gate line.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION

Reference will now be made in detail to the preferred embodiments of the present invention, examples of which are illustrated in the accompanying drawings.

Hereinafter, an LCD device according to the present invention and a method of fabricating the same will be described with reference to the accompanying drawings.

For the LCD device according to the present invention, a gate wiring of silver (Ag) is formed by using a self-assembled monolayer (SAM). At this time, the gate wiring includes a gate line, a gate pad and a gate electrode. The self-assembled monolayer can be easily adhered onto any of structures provided in an LCD panel. Thus, the method of the present invention can control the adherence state with easiness, in comparison with the related art printing method. Furthermore, it is possible to realize the gate wiring having the uniform line width and surface state.

The self-assembled monolayer corresponds to an organic-molecule layer which is regularly and spontaneously arranged on a surface of a corresponding substrate, wherein the self-assembled monolayer may be formed at a predetermined thickness below several tens μm.

The self-assembled monolayer makes a direct chemical bond with the molecules provided in the corresponding surface, so that it is possible to a stable molecule layer therebetween. Also, the self-assembled monolayer may be formed without restrictions in size and shape of the corresponding surface, especially, the self-assembled monolayer is suitable for the large-sized surface. Accordingly, the material for the self-assembled monolayer is easily adhered onto any structure of the LCD panels, so that the gate wiring can be easily formed in the LCD panel with the uniformity in line width and surface state.

Figure 1:
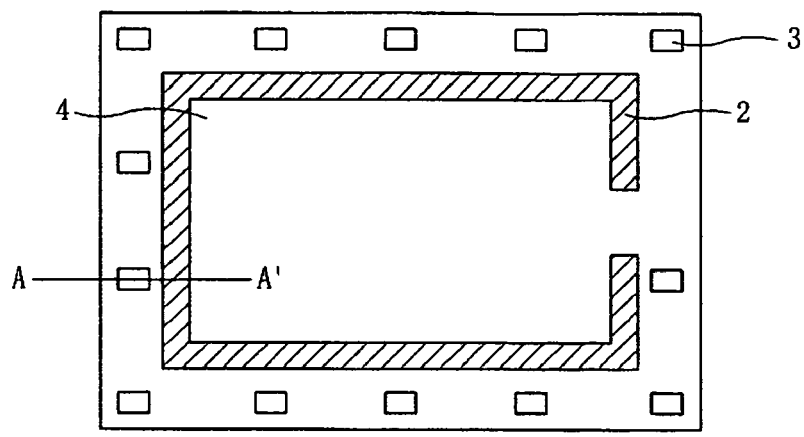
FIG. 1 is a plan view of illustrating a related art LCD device.
Figure 2:
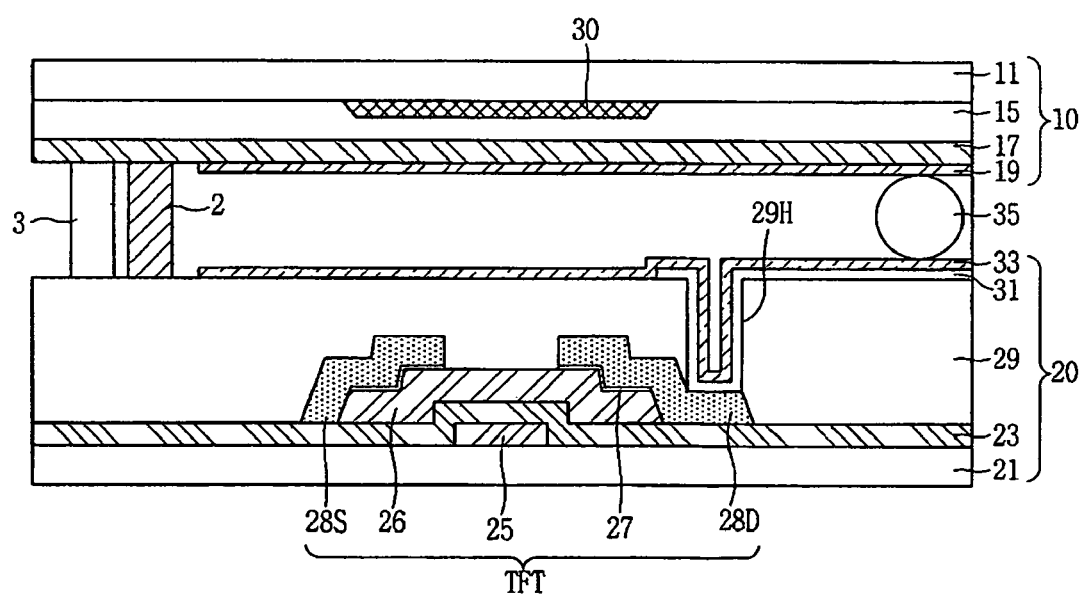
FIG. 2 is a cross section view along A-A' of FIG. 1.
Figure 3A:
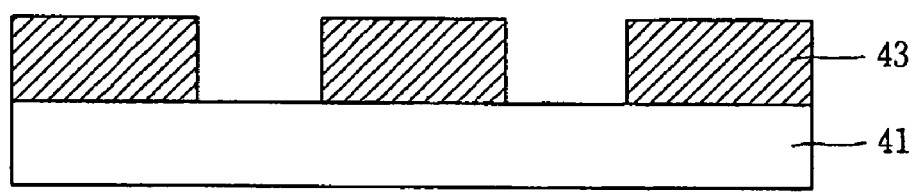
FIGS. 3A and 3B are cross section views of illustrating a method of fabricating an LCD device using a related art printing method.
Figure 3B:
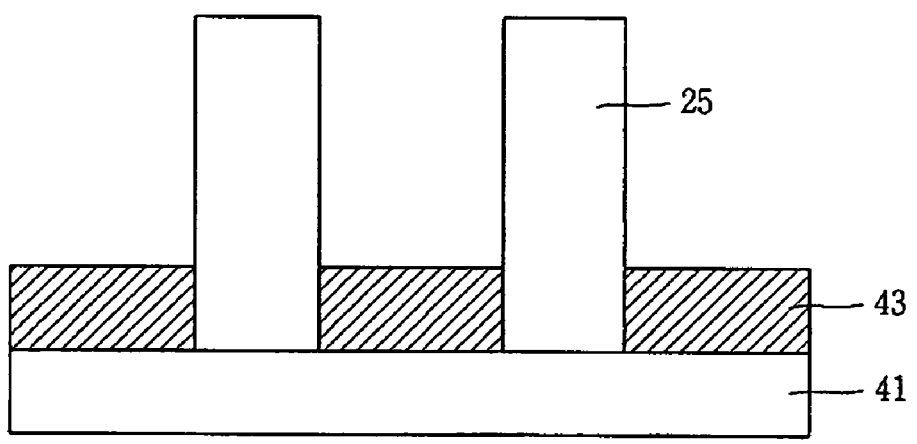
Figure 4:
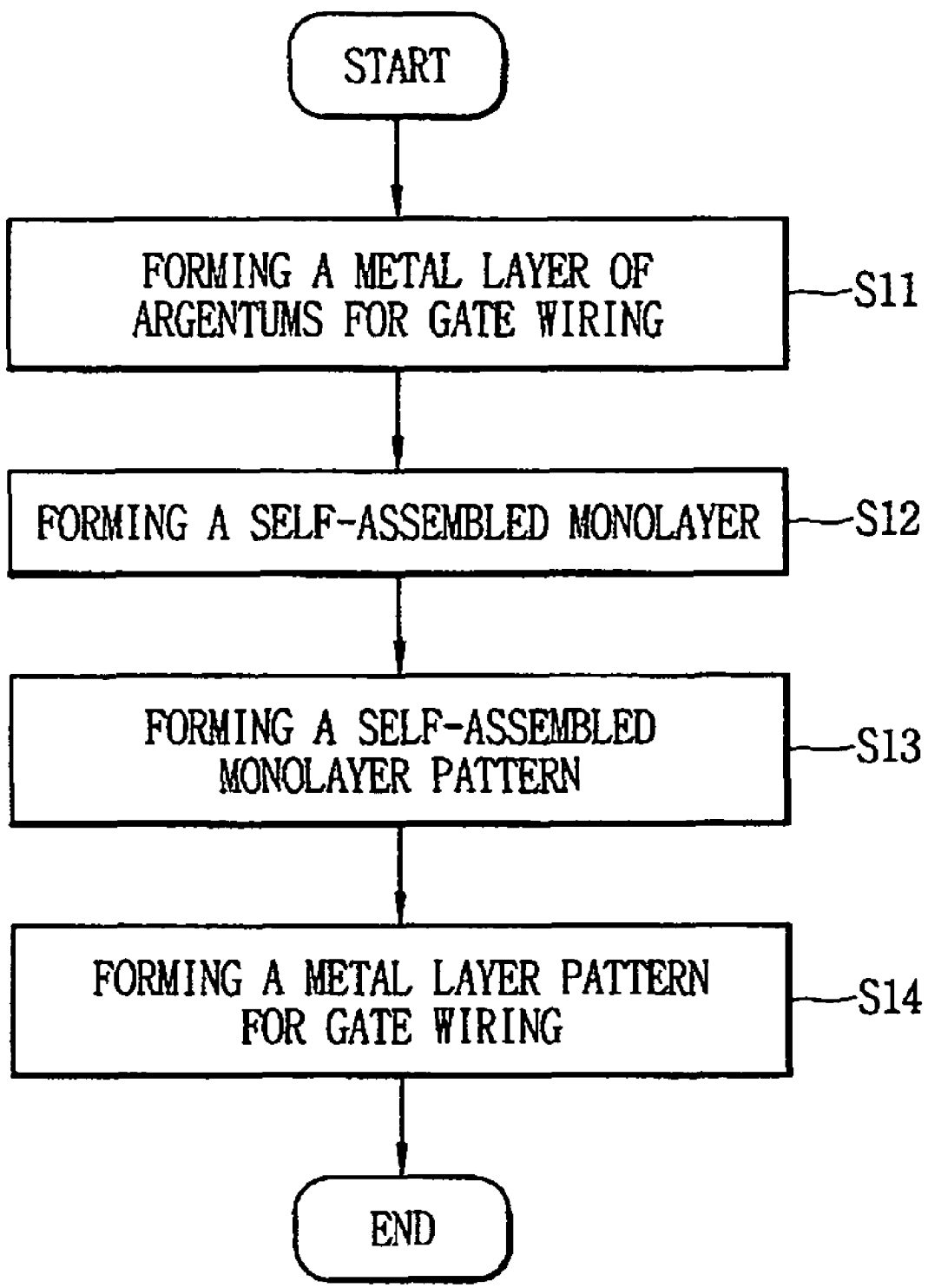
FIG. 4 is a flowchart of explaining a method of fabricating an LCD device according to an aspect of the present invention.

FIG. 4 is a flowchart of explaining a method of fabricating an LCD device according to the present invention.

As shown in FIG. 4, a metal layer of silver (Ag) for a gate wiring is formed on an insulating substrate (S11). At this time, a gate wiring area is is defined in the insulating substrate. The gate wiring area corresponds to an area for a gate line, a gate electrode and a gate pad.

Then, a self-assembled monolayer is formed on the insulating substrate including the metal layer of silver for the gate wiring (S12). After that, a self-assembled monolayer pattern is formed on the metal layer of silver for the gate wiring by using a mold mask. At this time, the self-assembled monolayer pattern covers the gate wiring area on the insulating substrate.

Thereafter, the metal layer of silver is etched by using the self-assembled monolayer pattern as a mask, thereby forming a metal layer pattern for the gate wiring. At this time, the gate wiring is formed of the self-assembled monolayer pattern and the metal layer pattern for the gate wiring.

Figure 5:
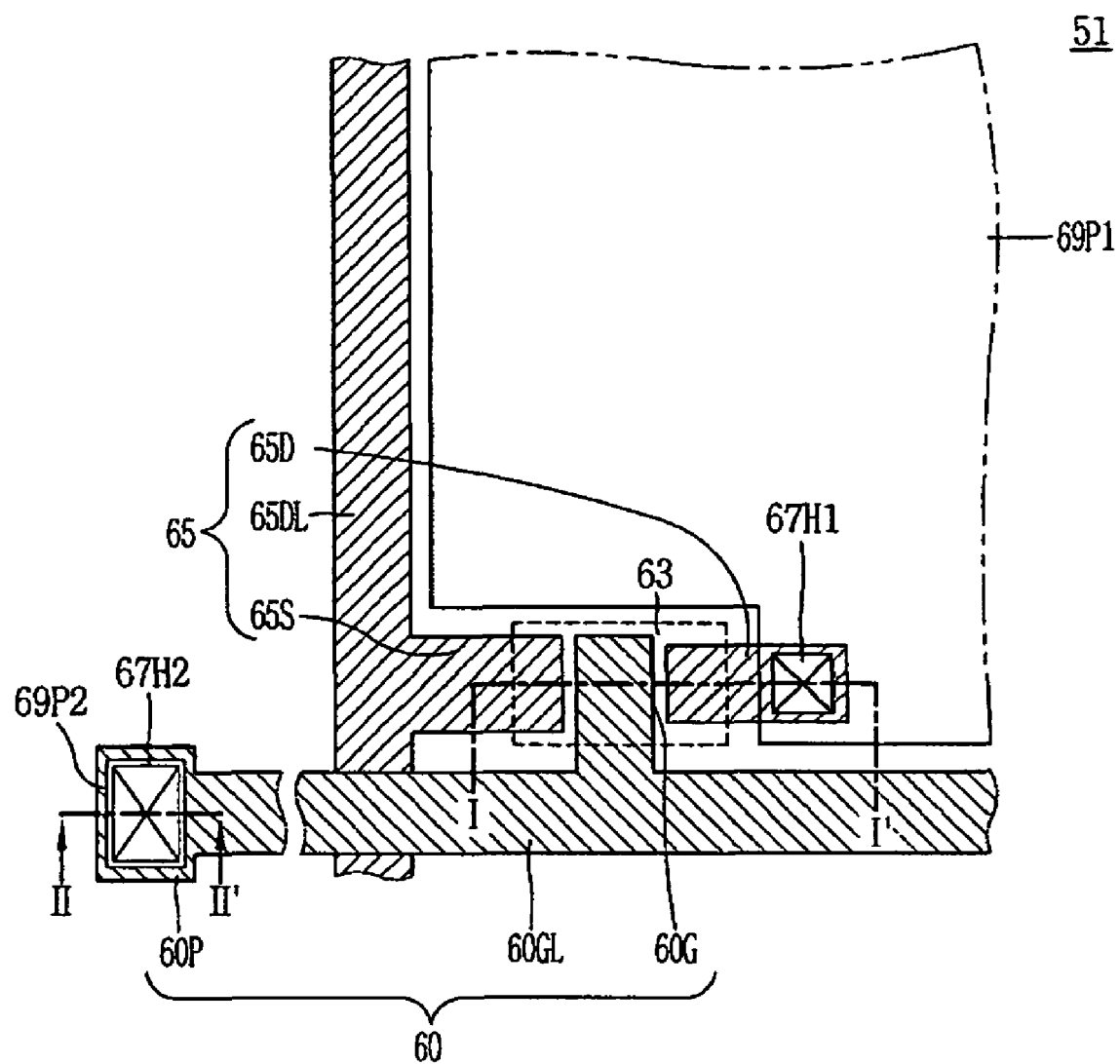
FIG. 5 is a plan view of illustrating an LCD device according to an aspect of the present invention.

FIG. 5 is a plan view of illustrating an LCD device according to the present invention.

As shown in FIG. 5, a gate line 60GL and a data line 65DL are formed on an insulating substrate 51, wherein the gate line 60GL and the data line 65DL are formed perpendicularly, thereby forming a pixel region. At this time, the gate line 60GL includes a gate pad 60P and a gate electrode 60G which are extending therefrom. At this time, the gate pad 60P, the gate electrode 60G and the gate line 60GL form a gate wiring 60. The gate pad 60P, the gate electrode 60G and the gate line 60GL are formed of the same metal layer of silver (Ag). The gate wiring 60 is formed of a dual-layered structure including the self-assembled monolayer and the metal layer of silver. That is, the gate pad 60P and the gate electrode 60G are formed of the dual-layered structure including the self-assembled monolayer and the metal layer of silver.

Also, the data line 65DL includes a data electrode 65D and a source electrode 65S. The source electrode 65S, the drain electrode 65D, a data pad (not shown), and the data line 65DL form a data wiring 65. The source electrode 65S, the drain electrode 65D, the data pad and the data line 65DL are patterned with the same metal layer.

The insulating substrate 51 corresponds to an array substrate. Also, a buffer layer (not shown) is interposed between the insulating substrate 51 and the gate wiring 60. Also, a gate insulating layer (not shown) is formed between the gate wiring 60 and the data wiring 65. Meanwhile, a glue layer (not shown) may be formed between the buffer layer and the gate wiring 60.

Then, a thin film transistor (TFT) is formed at a crossing of the gate line 60GL and the data lien 65DL, wherein the thin film transistor (TFT) functions as a switching device. The pixel region further includes a pixel electrode 69P1 which is connected with the thin film transistor (TFT). The pixel electrode 69P1 drives liquid crystal (not shown) together with a common electrode (not shown) of a color filter substrate (not shown).

The thin film transistor (TFT) is comprised of the gate electrode 60GL connected with the gate line 60GL; and the source and drain electrodes 65S and 65D connected with the data line 65DL. Also, the thin film transistor (TFT) includes an activation layer 63 which forms a transmission channel between the source and drain electrodes 65S and 65D according to a gate voltage supplied to the gate electrode 60G.

Then, a passivation layer (not shown) is formed on the substrate including the thin film transistor (TFT). The passivation layer has a first contact hole 67H1 and a second contact hole 67H2 which respectively exposes the drain electrode 65D and the gate pad 60P. On the passivation layer, there is the pixel electrode 69P1 which is electrically connected with the drain electrode 65D through the first contact hole 67H1. Also, a transparent conductive layer pattern 69P2 is formed on the passivation layer, wherein the transparent conductive layer pattern 69P2 is electrically connected with the gate pad 60P through the second contact hole 67H2. The pixel electrode 69P1 and the transparent conductive layer pattern 69P2 are patterned with the same transparent conductive layer.

Hereinafter, a method of fabricating an LCD device according to the present invention will be described with the accompanying drawings.

FIGS. 6A to 6F are cross section views of illustrating steps of fabricating an LCD device along I-I' of FIG. 5. FIGS. 7A to 7E are cross section views of illustrating steps of fabricating an LCD device along II-II' of FIG. 5.

Figure 6A:
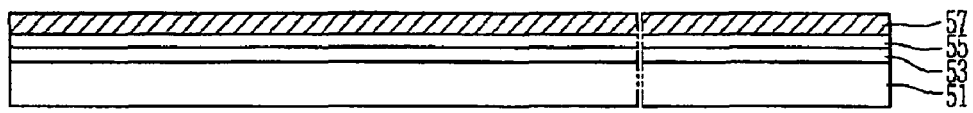
FIGS. 6A to 6F are cross section views of illustrating steps of fabricating an LCD device along I-I' of FIG. 5.
Figure 7A:
FIGS. 7A to 7F are cross section views of illustrating steps of fabricating an LCD device along II-II' of FIG. 5.

As shown in FIGS. 6A and 7A, an insulating substrate 51 is prepared. The insulating substrate 51 may be formed of an array substrate. The insulating substrate 51 may be formed of a glass material. Then, a metal layer 57 for a gate wiring is formed on the insulating substrate 51. At this time, a buffer layer 53 may be interposed between the metal layer 57 for the gate wiring and the insulating substrate 51. The buffer layer 53 may be formed of silicon Si and/or silicon oxide layer (SiOx). The gate wiring includes a gate electrode, a gate pad and a gate line.

Also, the metal layer 57 for the gate wiring may be formed of a metal layer of silver (Ag). If using the metal layer of silver (Ag), silver has the weak adhesion to the buffer layer 53. According layer, a glue layer 55 may be interposed between the buffer layer 53 and the metal layer 57 for the gate wiring, to thereby improve the adherence therebetween. The glue layer 55 may be formed of titanium Ti.

Figure 6B:
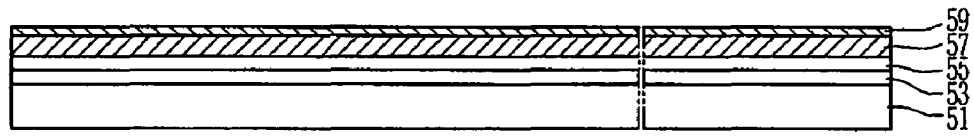
Figure 7B:
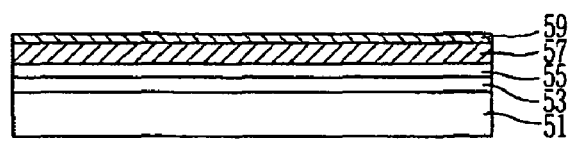

As shown in FIGS. 6B and 7B, a self-assembled monolayer 59 is formed on the insulating substrate including the metal layer 57 for the gate wiring. At this time, the substrate including the metal layer 57 for the gate wiring is coated with a composite for the self-assembled monolayer 59, and a thermal treatment or a UV-treatment is performed thereto, whereby the self-assembled monolayer 59 is formed on the substrate. At this time, the composite for the self-assembled monolayer includes chain-molecules having —SH functional group, for example, MCM (16-mercaptohe hexadecanoic acid) molecules, which is easily adsorbed to the surface of the metal layer of silver. The MCM molecule having —SH functional group is easily adsorbed to the surface of the metal layer of silver for the gate wiring. Also, the MCM molecule having —SH functional group has the good surface adsorption, in comparison to the silane functional group. In addition to the —SH functional group, —CN or —COOH functional group may be used.

Figure 6C:
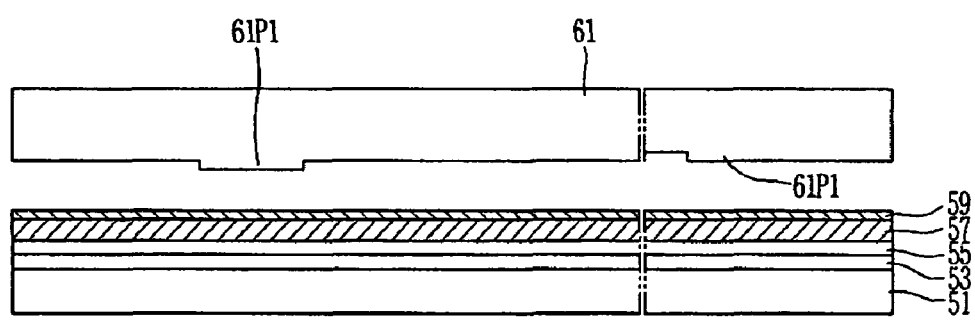
Figure 7C:
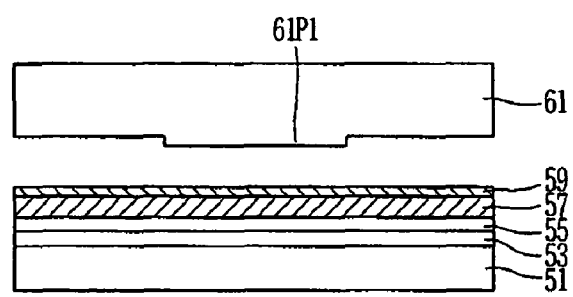

As shown in FIGS. 6C and 7C, a mold mask 61 is prepared above the substrate including the self-assembled monolayer 59. At this time, the mold mask 61 has a predetermined pattern 61P which exposes the gate wiring area. That is, the predetermined pattern 61P of the mold mask 61 exposes the portions for the gate electrode, the gate pad and the gate line.

Then, the predetermined pattern 61P of the mold mask 61 is printed to the self-assembled monolayer 59. At this time, UV rays or ozone (UV-O3) may be supplied in the printing process.

Figure 6D:
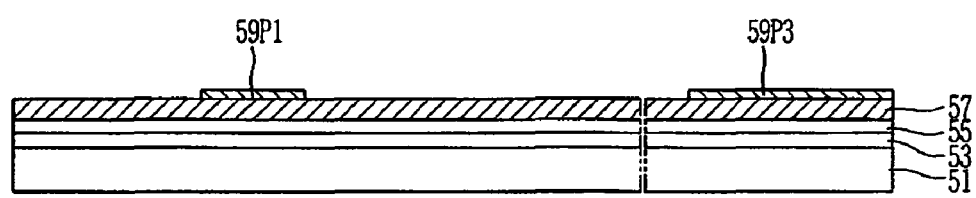
Figure 7D:
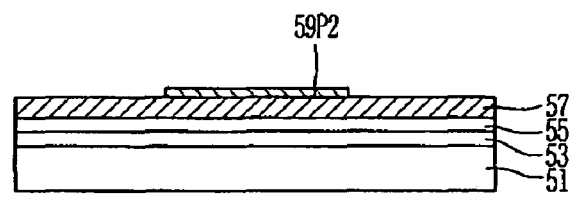

As shown in FIGS. 6D and 7D, the mold mask is removed. As a result, self-assembled monolayer patterns 59P1, 59P2 and 59Pe are formed in the surface of the metal layer 57 for the gate wiring, wherein the self-assembled monolayer patterns are the same as the predetermined pattern 61P of the mold mask 61. At this time, the reference number 59P1 corresponds to the self-assembled monolayer pattern for the gate electrode; the reference number 59P2 corresponds to the self-assembled monolayer pattern for the gate pad; and the reference number 59Pc corresponds to the self-assembled monolayer pattern for the gate line.

Figure 6E:
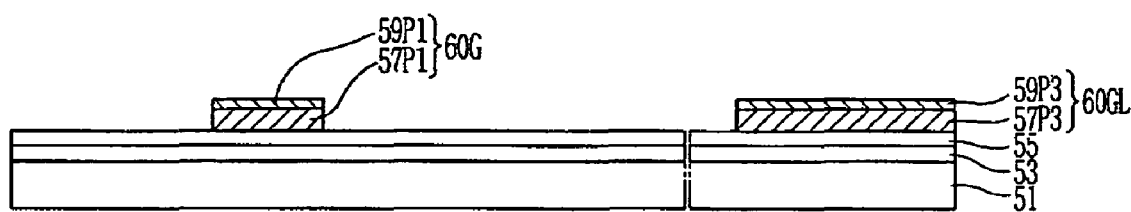
Figure 6F:
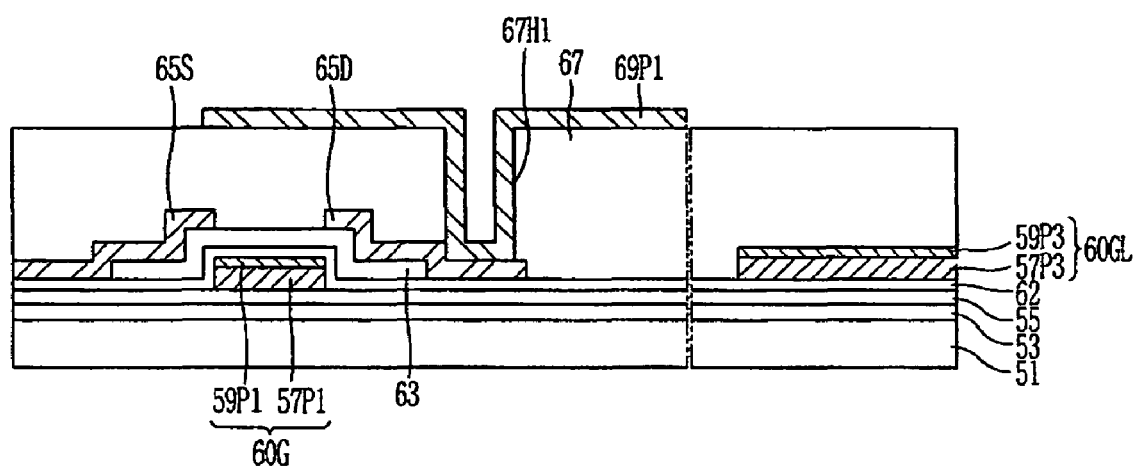
Figure 7E:
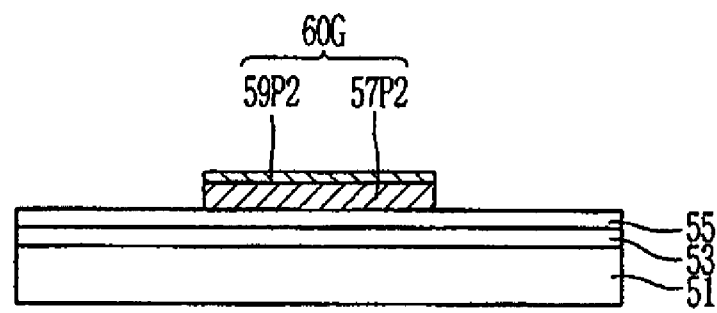
Figure 7F:
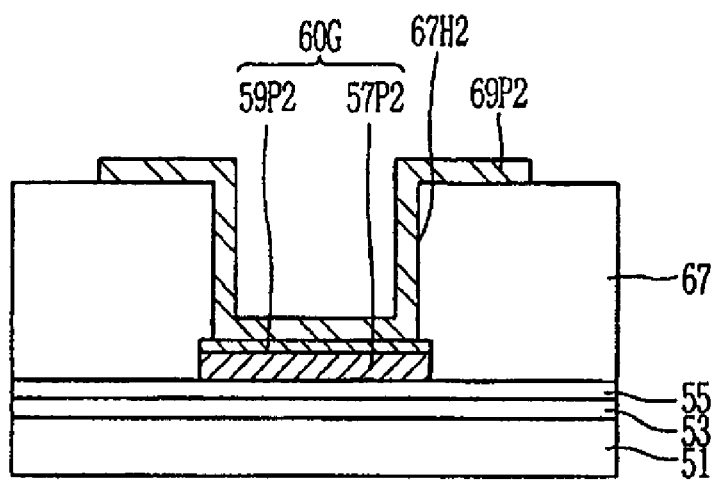

As shown in FIGS. 6E and 7E, the metal layer for the gate wiring is selectively etched thereby forming metal layer patterns for the gate wiring 60. That is, during the etching process, the predetermined portions of the metal layer for the gate wiring, corresponding to the self-assembled monolayer patterns 59P1, 59P2 and 59P3, are left, and the other portions are removed. At this time, the metal layer for the gate wiring is wet-etched by using first and second cyanide etchant.

During the wet-etching process, the self-assembled monolayer patterns 59P1, 59P2 and 59P3 prevent the metal layer for the gate wiring from being eroded.

As a result, the gate wiring 60 is formed, which includes the self-assembled monolayer pattern and the metal layer pattern deposited in sequence. That is, the gate electrode 60G is comprised of the self-assembled monolayer pattern 59P1 and the metal layer pattern 57P1 deposited in sequence. The gate pad 60P is comprised of the self-assembled monolayer pattern 59P2 and the metal layer pattern 57P2 deposited in sequence. The gate line 60GL is comprised of the self-assembled monolayer pattern 59P3 and the metal layer pattern 57P3 deposited in sequence.

Next, a gate insulating layer 62 is formed on the substrate including the gate wiring 60. The gate insulating layer 62 may be formed of silicon oxide or silicon nitride. Then, an active layer 63 of silicon material is formed on the substrate including the gate insulating layer 62. Then, a metal layer for the data wiring is deposited on the substrate including the active layer 63, and is patterned thereby forming the data wiring 65 (including 65S, 65D and 65DL). At this time, the data wiring 65 includes the source electrode 65S, the drain electrode 65D and the data line 65DL. Then, a passivation layer 67 is formed on the substrate including the data wiring 65, and is then etched to thereby form first and second contact holes 67H1 and 67H2, wherein the first and second contact holes 67H1 and 67H2 respectively expose the drain electrode 65D and the gate pad 60P. After that, a transparent conductive layer is formed on the substrate including the first and second contact holes, and is then patterned, thereby forming a pixel electrode 69H1 and a transparent conductive layer pattern 69P2. At this time, the pixel electrode 69H1 is formed in the first contact hole 67H1, wherein the pixel electrode 69H1 is electrically connected with the drain electrode 65D. Also, the transparent conductive layer pattern 69P2 is formed in the second contact hole 67H2, wherein the transparent conductive layer pattern 69P2 is electrically connected with the gate pad 60P.

As mentioned above, the LCD device according to the present invention has the following advantages.

In the LCD device according to the present invention, the gate line is formed of the metal layer of silver by using the self-assembled monolayer. Accordingly, in comparison with the related printing method, the above-mentioned method of the present invention has the good adsorption control. Furthermore, it is possible to improve the uniformity in line width and surface state of the gate wiring.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. An LCD device comprising:
   an insulating substrate; and
   a gate wiring layer overlying the insulating substrate, wherein the gate wiring includes a gate electrode, a gate pad and a gate line, and
   wherein the gate wiring layer comprises a dual-layered structure including metal layer having silver and a self-assembled monolayer overlying the metal layer.

2. The LCD device of claim 1 further comprising a buffer layer between the insulating substrate and the gate wiring layer.

3. The LCD device of claim 2, wherein the buffer layer comprises a Si layer and/or SiOx layer.

4. The LCD device of claim 2 further comprising a glue layer between the buffer layer and the gate wiring layer.

5. The LCD device of claim 4, wherein the glue layer comprises Ti.

6. An LCD device comprising:
   an insulating substrate;
   a gate electrode overlying the insulating substrate, wherein the gate electrode comprises a dual-layered structure including a metal layer comprising silver and a self-assembled monolayer overlying the metal layer;
   a gate insulating layer overlying the insulating substrate and the gate electrode;
   an active layer overlying the gate insulating layer;
   source and drain electrodes on the active layer, wherein the source electrode is separated from the drain electrode by a fixed distance; and
   a pixel electrode coupled to the drain electrode.

7. The LCD device of claim 6 further comprising a buffer layer between the insulating substrate and the gate electrode.

8. The LCD device of claim 7 further comprising a glue layer between the buffer layer and the gate electrode.

9. The LCD device of claim 8, wherein the glue layer comprises Ti.

* * * * *